United States Patent [19]

Lui et al.

[11] Patent Number: 5,568,081

[45] Date of Patent: Oct. 22, 1996

[54] VARIABLE SLEW CONTROL FOR OUTPUT BUFFERS

[75] Inventors: Henry Y. Lui, San Jose; Sammy S. Y. Cheung, Pleasanton, both of Calif.

[73] Assignee: Cypress Semiconductor, Corporation, San Jose, Calif.

[21] Appl. No.: 483,068

[22] Filed: Jun. 7, 1995

[51] Int. Cl.⁶ .................... H03K 17/16; H03K 17/687
[52] U.S. Cl. .................... 327/380; 327/108; 327/170; 327/306; 327/374; 326/83; 326/27; 326/62
[58] Field of Search .................... 327/170, 374, 327/380, 310, 322, 379, 384, 112, 100, 108, 170, 306; 326/27, 58, 83, 26, 82, 62

[56] References Cited

U.S. PATENT DOCUMENTS 4,357,681  11/1982  Chadra ............................ 364/900
4,859,870  8/1989  Wong et al. ..................... 327/100
5,013,940  5/1991  Ansei ............................. 326/27
5,266,847  11/1993  Kuo ............................... 327/108

Primary Examiner—Timothy P. Callahan
Assistant Examiner—Dinh T. Le
Attorney, Agent, or Firm—Blakely, Sokoloff, Taylor & Zafman

[57] ABSTRACT

A variable slew control for output circuits is disclosed. The slew control circuit automatically adjusts the rate in which voltage on a slew node is driven to a reference voltage, minimizing noise at the output device driver. The variable slew control decreases the slew rate of the slew node during periods when di/dt is at a high level, but allows the voltage on the slew node to drop at faster rates during times when di/dt at the output driver is low.

12 Claims, 10 Drawing Sheets

VARIABLE SLEW CONTROL FOR OUTPUT BUFFERS

FIELD OF THE INVENTION

The present invention relates to output buffers in integrated circuits. More specifically, the present invention relates to an apparatus for reducing noise generated by output buffers.

BACKGROUND OF THE INVENTION

Integrated circuit chips are typically mounted on lead frames which are connected to the circuit board by rows of conductive pins. Bonding wires extend from the output pads on the chip to adjacent pads on the lead frame. Lead frame wires extend from the adjacent pads to the conductive pins.

As output transistors are switched on and off at higher speeds, larger di/dt transients are generated in the output current flowing through the packaging wires that connect the pad to the circuit board. This increased rate of current change generates noise comprising voltage spikes on the power rails. The magnitude of the voltage spikes generated along the packaging wires between the chip power pad and the conductive pin is the measurement of di/dt multiplied by the inductance of the lead frame. The voltage spikes cause a voltage differential between the lead location on the circuit board and the bonding pad it is connected to on the integrated circuit. They cause troublesome random events in the chip circuitry such as causing the internal supply to be a different voltage than the voltage of the external supply.

One approach used in the prior art to decrease noise on the power rails was to decrease the slew rates at which transistors on the power rails switched on and off. FIG. 1 illustrates a circuit implementing this approach. The prior art circuit comprises an output buffer 190 and a device driver circuit 191. A signal from sense amplifier line 110 is sent to pull-up inverter 115 and pull-down inverter 116 in output buffer 191. Pull-up inverter 115 controls the gate of output switch 125 in device driver 191 by controlling the voltage on slew node 120. Pull-down inverter 116 controls the gate of output switch 126 in device driver 191 by controlling the voltage on slew node 121. The switch rate of output switches 125 and 126 determines the magnitude of di/dt on output pad 140. Resistor 130 is coupled between pull-up inverter 115 and ground and decreases the rate at which the voltage on slew node 120 is driven to ground. Resistor 131 is coupled between pull-down inverter 116 and ground and decreases the rate at which the voltage on slew nodes 121 is driven to ground. This decreases the rate at which output switches 125 and 126 are turned off, thus decreasing noise at the output pad 140.

Although the implementation of resistive elements to decrease the slew rate at which the slew nodes are driven to ground decreases noise at the output pad, the speed at which the integrated circuit switches is also affected. The prior art solution decreases the slew rate of the slew nodes even when di/dt is not at high rate. This often slows the performance of the integrated circuit unnecessarily. Moreover, the prior art approach fixes the slew-rate at a predetermined level, making it unadjustable to accommodate the noise level difference among different packages which have different lead frame inductance.

Thus, an output circuit which can variably control the level of noise on its I/O pad while maintaining an optimal switching rate is desired.

SUMMARY OF THE INVENTION

An output circuit is described. The output circuit comprises a first line for receiving an input signal to the output circuit. The output circuit further comprises a second line programmable to one of a first and second state. A first circuit coupled to the first line has a first slew node. The first circuit responds to the input signal and controls a voltage on the first slew node. A second circuit is coupled to the first line and has a second slew node. The second circuit responds to the input signal for controlling a voltage on the second slew node. A driver circuit responds to the voltages on the first and second slew node for generating an output signal.

In one embodiment of the present invention, a first slew control unit is coupled to the first circuit and a second slew control unit is coupled to the second circuit. The first and second slew control units regulate the rate in which the voltage on the pull-up slew node and the rate in which the voltage on the pull-down slew node are driven to ground in response to the first and second state on the second line.

In another embodiment of the present invention, a first variable slew control circuit is coupled to the first node and a second variable slew control circuit is coupled to the second slew node. First and second variable slew control circuits reduce the rate in which voltages on the first and second slew nodes are driven to ground during instances when di/dt is high at the output pad. First and second variable slew control circuits minimize noise at the device driver circuit while achieving optimal switching performance.

In another embodiment of the present invention, a pull-up control circuit is coupled to the second slew node for decreasing the rate in which the second slew node is driven to a supply voltage when di/dt at the device driver circuit is above a predetermined level.

BRIEF DESCRIPTION OF THE DRAWINGS

The present invention will be understood more fully from the detailed description given below and the accompanied drawings of the various features and elements embodied in the invention. The description and drawings are not meant to limit the invention to the specific embodiment. They are provided for explanation and understanding.

DETAILED DESCRIPTION

A variable slew rate controller for output buffers is described. In the following detailed description, numerous specific details are set forth in order to provide a thorough understanding of the present invention. However, it will be understood by those skilled in the art that the present invention may be practiced without these specific details. In other instances, well-known methods, procedures, components, and circuits have not been described in detail so as not to obscure the present invention.

Figure 1:
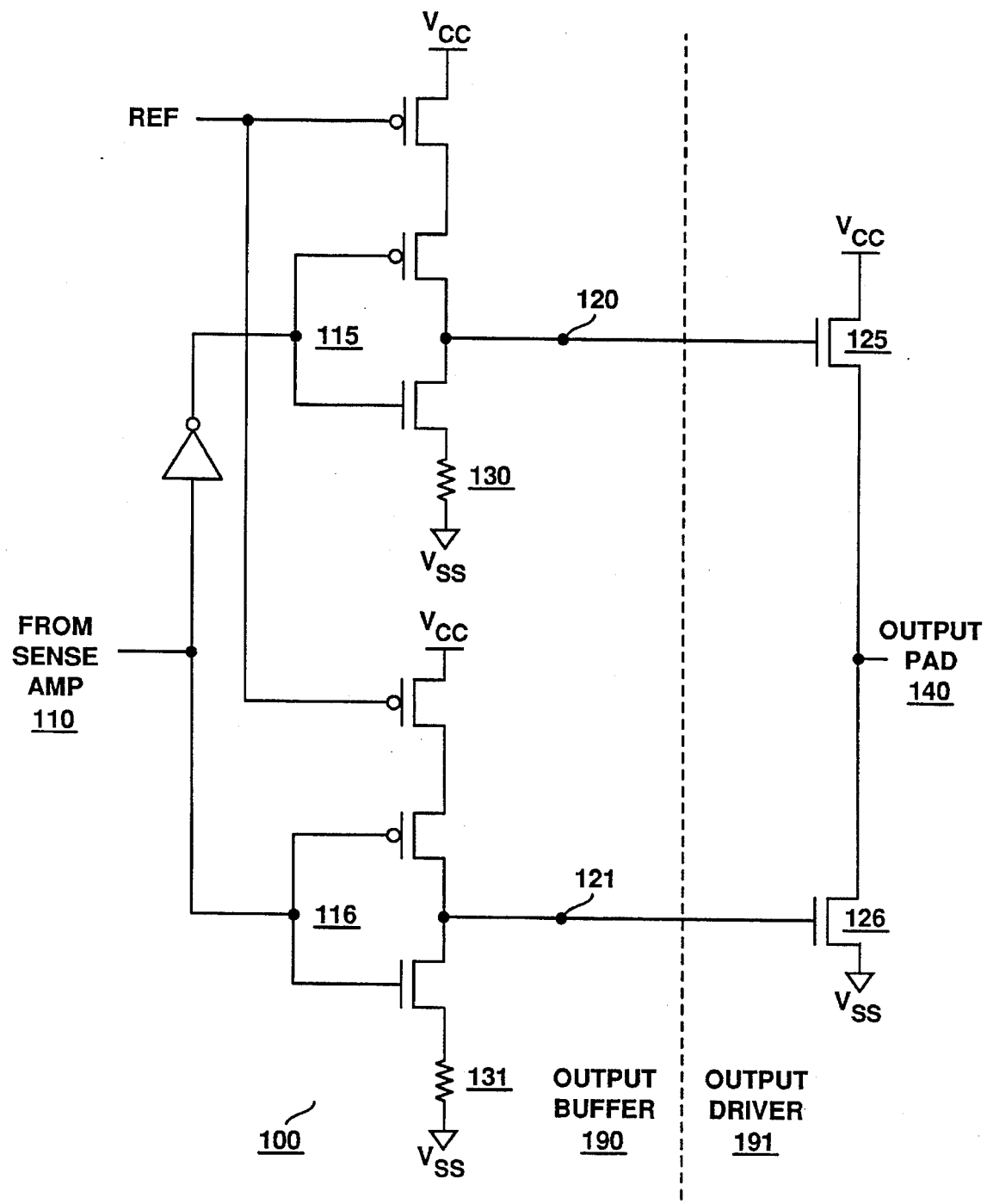
FIG. 1 illustrates a prior art output circuit.
Figure 2:
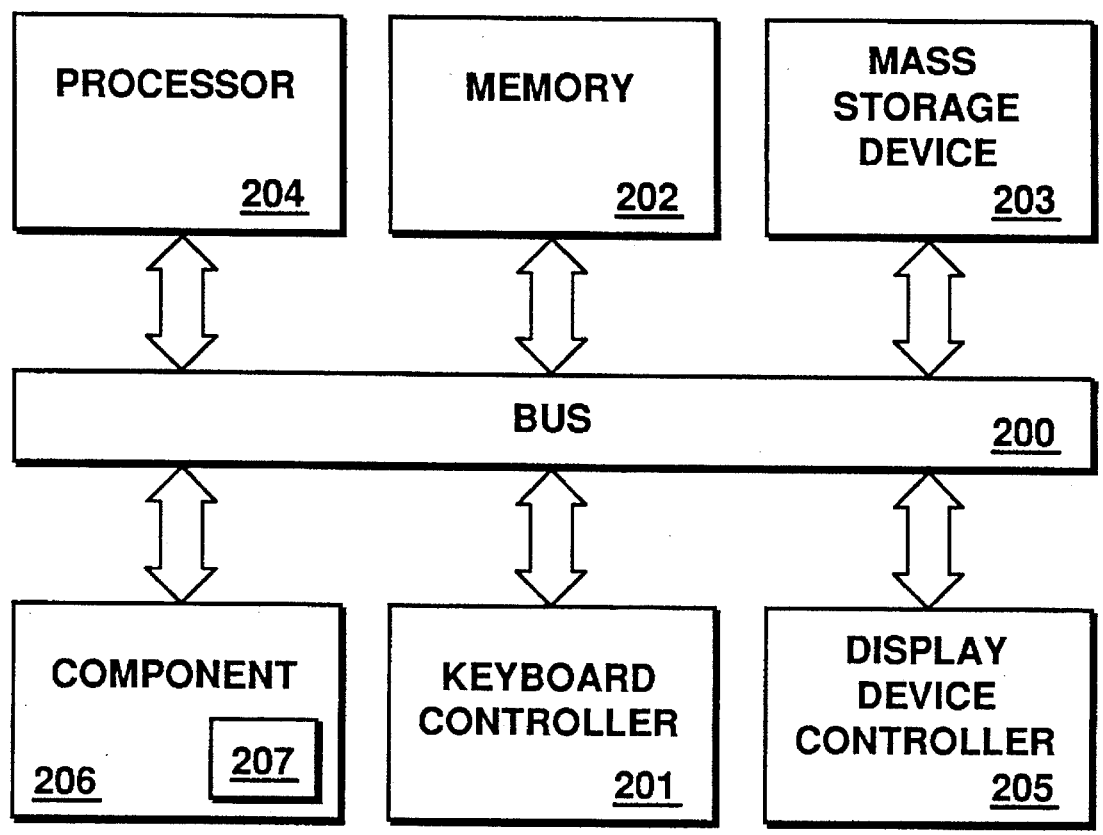
FIG. 2 illustrates a computer system configured with one embodiment of the present invention.

FIG. 2 illustrates a computer system of one embodiment of the present invention in block diagram form. The computer system comprises bus 200, keyboard interface 201, external memory 202, mass storage device 203, processor 204 and display device controller 205. Bus 200 is coupled to display device controller 205, keyboard interface 201, microprocessor 204, memory 202, and mass storage device 203. Display device controller 205 can be coupled to a display device. Keyboard interface 101 can be coupled to a keyboard.

Bus 200 can be a single bus or a combination of multiple buses. As an example, bus 200 can comprise an Industry Standard Architecture (ISA) bus, an Extended Industry Standard Architecture (EISA) bus, a system bus, an X-bus, a Micro Channel Architecture (MCA) bus, a Peripheral Component Interconnect (PCI) bus, a Personal Computer Memory Card International Association (PCMCIA) bus or other buses. Bus 200 can also comprise a combination of any buses. Bus 200 provides communication links between components in the computer system. Keyboard interface 201 can be a keyboard controller or other keyboard interface. Keyboard interface 201 can be a dedicated device or can reside in another device such as a bus controller or other controller. Keyboard interface 201 allows a keyboard to be coupled to the computer system and transmits signals from a keyboard to the computer system. External memory 202 can comprise a dynamic random access memory (DRAM) device, a static random access memory (SRAM) device, or other memory devices. External memory 202 stores information and data from mass storage device 203 and processor 204 for use by processor 204. Mass storage device 203 can be a hard disk drive, a floppy disk drive, a CD-ROM device, a flash memory device or other mass storage device. Mass storage device 203 provides information and data to external memory 202.

Processor 204 processes information and data from external memory 202 and stores information and data into external memory 202. Processor 204 also receives signals from keyboard controller 201 and transmits information and data to display device controller 205 for display on a display device. Processor 204 also transmits video images to a display controller for display on a display device. Processor 204 can be a complex instruction set computing (CISC) microprocessor, a reduced instruction set computing (RISC) microprocessor, a very long instruction word (VLIW) microprocessor or other processor device. Display device controller 205 allows a display device to be coupled to the computer system and acts as an interface between the display device and the computer system. Display device controller 205 can be a monochrome display adapter (MDA) card, a color graphics adapter (CGA) card, enhanced graphics adapter (EGA) card, Multi-Color Graphics Array (MCGA) card, a Video Graphics Array (VGA) card, a Super VGA card, an Extended Graphics Array (XGA) card or other display device controller. The display device can be a computer monitor, a flat panel display, or other display device. The display device receives information and data from processor 204 though display device controller 205 and displays information and data for the user of the computer system.

The computer system also comprises semiconductor component 206 which is coupled to bus 200. Semiconductor component 206 can be a memory, a controller, a logic circuit or other device. Semiconductor component 206 in turn comprises an output circuit 207 having a first line for receiving an input signal, a second line programmable to one of a first and second state, and a first circuit coupled to the first line having a pull-up slew node where the first circuit is responsive to the input signal for controlling a voltage on the pull-up slew node. The output circuit 207 also has a second circuit responsive to the input signal for controlling a voltage on the pull-down slew node, and a driver circuit responsive to the voltage on the pull-up slew node and the voltage on the pull-down slew node for generating an output signal. In one embodiment of the present invention, output circuit 207 further comprises a first slew control unit coupled to the first circuit and a second slew control unit coupled to the second circuit for controlling the rates in which voltages on the slew nodes are driven to ground. By decreasing the slew rates at the slew nodes, first slew control unit and second slew control unit decreases the noise generated by excessive di/dt at the device driver circuit.

Alternatively, the output circuit described above may be used in keyboard interface 201, memory 202, processor 204 or display device controller 205.

Figure 3:
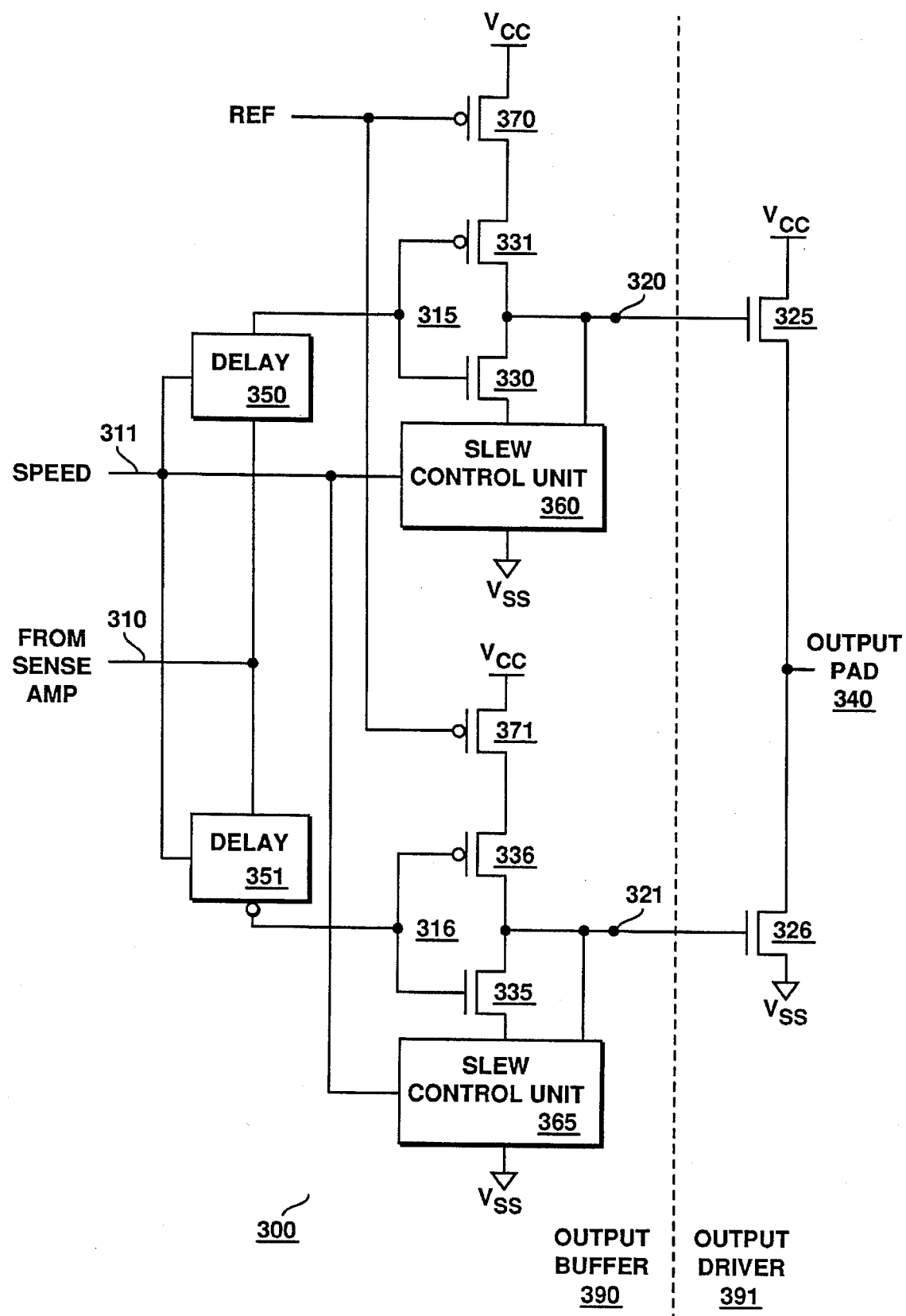
FIG. 3 is a block diagram illustrating one embodiment of the present invention.

FIG. 3 illustrates a block diagram of one embodiment of an output circuit according to the present invention. Output circuit 300 comprises output buffer 390 and output driver circuit 391. Output buffer 390 is coupled to output driver 391. Output driver 391 includes pull-up output switch 325 and pull-down output switch 326, and output pad 340. The output switches shown in FIG. 3 are N-channel MOS transistors with a common node for the drain of transistor 326 and the source of transistor 325 and output pad 340. The output transistors have their control gates connected to pull-up slew node 320 and pull-down slew node 321. During normal bi-state operation, the output switches are in opposite conductive states and the output pad is either pulled down to Vss or pulled up to Vcc.

Pull-up inverter 315 controls the gate of output switch 325. Pull-down inverter 316 controls the gate for output switch 326. Pull-up inverter 315 in the referred embodiment is a CMOS inverter having an N-channel high-to-low transistor 330 and a P-channel low to high transistor 331 with a common drain between connected to pull-up slew node 320. The gates of transistors 330 and 331 are controlled by the voltage on sense amplifier line 310. Because transistors 330 and 331 have the opposite channel polarity, they respond oppositely to voltages at sense amplifier line 310 and are always in opposite conductive states. When the voltage on line 310 changes from low to high, transistor 331 turns off and transistor 330 turns on. Likewise, when the voltage on line 310 changes from high to low, transistor 331 turns on and transistor 330 turns off. Pull-down inverter 316 is similar to pull-down inverter in construction and operation. The common drains of transistor inverter 316 are connected to pull-down slew node 321 for controlling pull-down transistor 326. The gates of these transistors are also electrically connected to sense amplifier line 310.

Slew control unit 360 is connected between inverter 315 and ground. Slew control unit 365 is connected between inverter 316 and ground. Slew control units 360 and 365 regulate the turn-off time of output transistor 325 during pull-down and the turn-off time of output transistor 326 during pull-up. Slew control units 360 and 365 respond to a voltage signal on speed line 11. A low voltage signal on line 311 directs slew control units 360 and 365 to decrease the rate at which voltage at slew nodes 320 and 321 are driven to ground. A decrease in the rate in which slew nodes 320 and 321 are driven to ground permits output transistors 325 and 326 to turn off gradually over a longer time thus reducing di/dt of the decreasing output current. A high voltage signal on line 311 would direct slew control units 360 and 365 to increase the rate at which slew nodes 320 and 321 are driven to ground. This permits output transistors 325 and 326 to turn off quickly over a shorter period of time, increasing the switching speed of the component.

Delay unit 350 is coupled to inverter 315 and delay unit 351 is coupled to inverter 316. To prevent a short circuit, delay units 350 and 351 delay signals from sense amplifier line 310 to inverters 315 and 316 such that output switch 325 is switched off before output switch 326 is switched on and output switch 326 is switched off before output switch 325 is switched on.

Speed line 311 gives output circuit 207 the option of increasing or decreasing the turn-off slew rates of output switches 325 and 326. The output circuit 207 can elect to decrease the slew rate of output switches 325 and 326 for components without effective noise immunity. This reduces di/dt caused by falling voltages on slew nodes and thus the overall noise in the component. On the other hand, output circuit 207 can elect to increase the slew rates of output switches 325 and 326 for components with good noise immunity. This allows output switches 325 and 326 to operate at a higher speed. The polarity of the speed signal can be changed by programming an EPROM or a fuse bit in output circuit 207.

Supply Vcc is coupled through constant current transistor 370 to inverter 315 for controlling the turn-on time of output transistor 325 during pull-up. Supply Vcc is also coupled through constant current transistor 371 to inverter 316 for controlling the turn-on time of output transistor 326 during pull-down. Transistors 370 and 371 have a high impedance state determined by W/L sizing for maintaining a low discharge current which extends the slew period while either output transistor 325 or 326 turns on. Transistors 370 and 371 are controlled by a reference voltage applied at the control electrode to provide a generally constant current. Transistors 370 and 371 delays the start of turn-on to prevent "crowbar" current in the output circuit caused by simultaneous conduction in both output transistors. The low currents though transistors 370 and 371 prolong the turn-on time for reducing di/dt of the increasing current though output transistors 325 and 326 when they are turned on.

Figure 4:
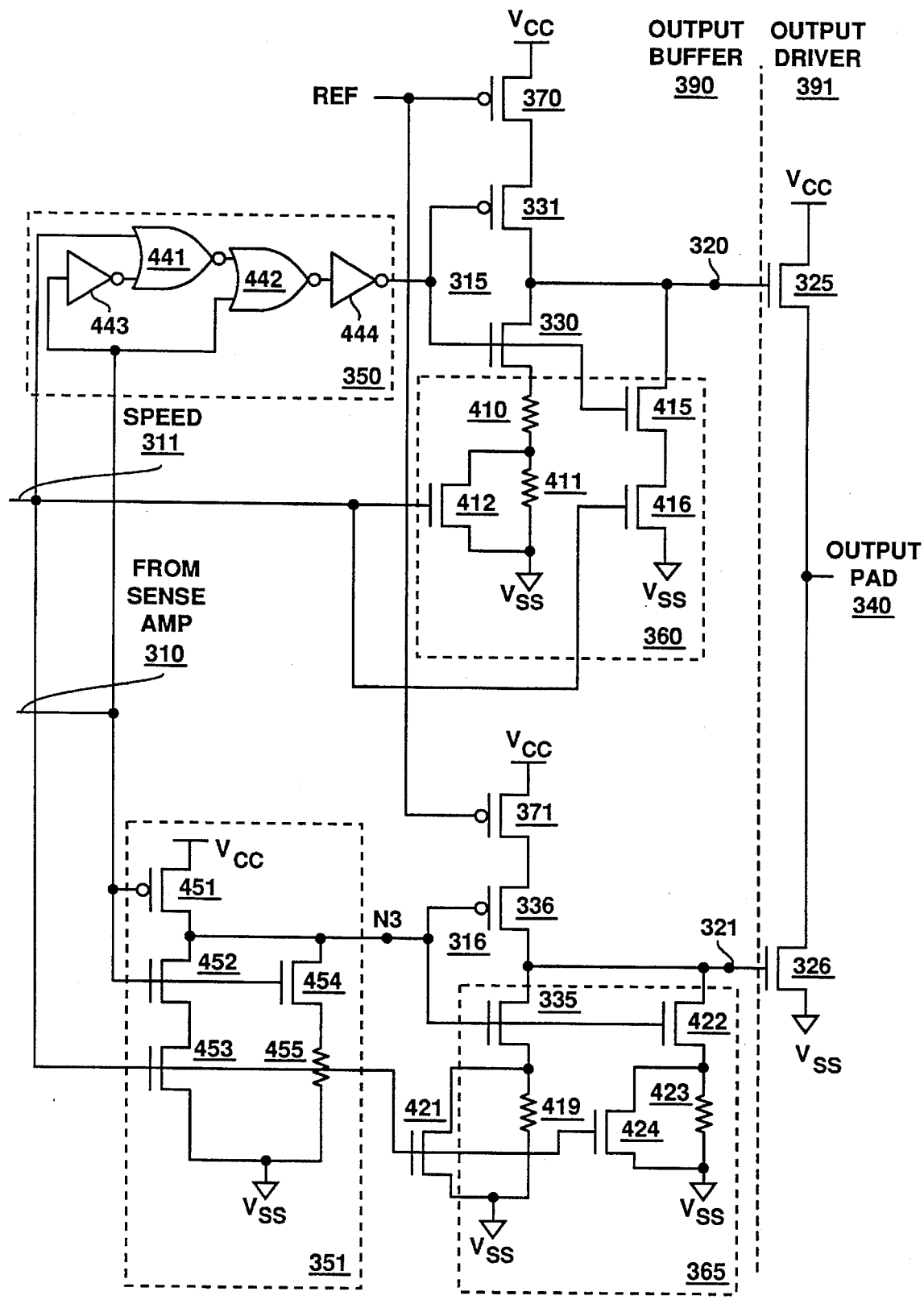
FIG. 4 is a schematic of an output circuit according to one embodiment of the present invention.

FIG. 4 illustrates a schematic of an output circuit according to one embodiment of the present invention. Slew control unit 360 comprises two falling paths for slew node 320. A first falling path is controlled by resistors 410 and 411 and transistor 412. Resistor 410 is coupled to the source of transistor 330 of inverter 315. Resistor 411 and transistor 412 are coupled in parallel to resistor 410 and ground. The gate of transistor 412 is coupled to speed line 311. A second falling path is controlled by transistors 415 and 416. The drain of transistor 415 is coupled to slew node 320. The source of transistor 415 is coupled to the drain of transistor 416. The gate of transistor 415 is coupled to sense amplifier line 310 through delay unit 350. The gate of transistor 416 is coupled to speed signal 311. The source of transistor 416 is connected to ground.

When the signal on sense amplifier line 310 switches from low to high, the current at slew node 320 is driven to ground. When speed line 311 is inactive, the second falling path connecting slew node 320 to ground through transistors 415 and 416 is off. Resistors 410 and 411 allows the current at slew node 320 to be driven to ground slowly, permitting transistor 325 to turn off gradually over a period of time. This reduces di/dt of the decreasing output current. When speed line 311 is active, a high signal on line 311 switches transistor 412 on, providing a bypass passage for current traveling on the first falling path around resistor 411. The high signal on speed line 311 also switches transistor 416 on, providing a second falling path for driving current at slew node 320 to ground. The bypass around resistor 411 on the first falling path and the addition of a second falling path allows current on slew node 320 to be driven to ground more quickly. This allows output switch 325 to be switched off at a faster rate.

Slew control unit 365 comprises two falling paths for slew node 321. A first falling path is controlled by resistor 419 and transistor 421. Resistor 419 is coupled between the source of transistor 335 of inverter 316 and ground. The gate of transistor 421 is electrically connected to speed line 311 and the source of transistor 421 is connected to ground. A second falling path is controlled by transistors 422, transistors 424 and resistor 423. The drain of transistor 422 is coupled to slew node 321. The gate of transistor 422 is coupled to the sense amplifier line 310 through delay unit 351. Resistors 423 and transistor 424 are coupled in parallel to the source of transistor 422 and ground. The gate of transistor 424 is electrically connected to speed line 311.

When the signal on sense amplifier line 310 switched from high to low, the current at slew node 321 is driven to ground. When speed line 311 is inactive, a first falling path connecting slew node 321 to ground through resistor 419 is open and a second falling path connecting slew node 321 to ground through transistor 422 and resistor 423 is open. Resistor 419 allows the current at slew node 321 to be driven to ground slowly through path one and resistor 423 allows current at slew node 321 to be driven to ground through path two. This permits transistor 326 to turn off gradually over a period of time. This reduces di/dt of the decreasing output current. When speed line 311 is active, a high signal on line 311 switches transistor 421 on, providing an additional passage for current traveling on the first falling path. The high signal on speed line 311 also switches transistor 424 on, providing a bypass passage for current traveling on the second falling path around resistor 423. The bypass passages provided by transistors 421 and 424 allow current on slew node 321 to be driven to ground more quickly. This allows output switch 326 to be switched off at a faster rate.

FIG. 4 also illustrates one embodiment of delay units 350 and 351. Delay unit 350 comprises NOR gates 441 and 442 and inverters 443 and 444. When speed line 311 is active, delay unit 350 is disabled. Delay unit 351 comprises transistors 451, 452, 453 and 454 and resistor 455. When speed line 311 is inactive, resistor 455 delays a signal switch from high to low to inverter 316. If speed is high, transistor 453 is switched on to provide a non-delayed path through transistors 452 and 453.

Delay units 350 and 351 are activated by the speed signal. Thus, delay units 350 and 351 are enabled when slew control units 360 and 361 are enabled. When output pad 340 switches from high to low, slew node 320 switches from low to high. During this transition, transistors 325 and 326 should not both be at an on state at the same time. Otherwise, "crowbar" short circuit current will flow from Vcc to ground through transistors 325 and 326. "Crowbar" short circuit current increases the current consumption of the chip and delays the switching speed at output pad 340. To reduce "crowbar" current, transistor 325 is turned on after transistor 326 is turned off. This requires slew node 320 to go high after slew node 321 goes low. However, the speed of output transition will be reduced unnecessarily if slew node 320 goes high a long time after slew node 321 has gone low. Therefore, to optimize speed and performance, it is preferred to have slew node 320 go high immediately after slew node 321 goes low. Similarly, when the output pad 340 is to be switched from high to low, to optimize speed and performance, it is preferred to have slew node 321 to be driven high immediately after 320 is driven low.

The output buffer 390 is constructed with consideration of this preferred timing. During the output low to high transition, when speed signal 311 is high, slew control unit 365 pulls down slew node 321 quickly. At the same time, delay unit 350 is disabled by the speed signal on line 311 such that inverter 315 quickly responds to sense amplifier signal on line 310. As a result, slew node 320 is pulled up quickly immediately after slew node 321 is low. When the speed signal on line 311 is low, slew control unit 365 pulls down slew node 321 slowly. At the same time, the delay unit 350 is enabled by signal 311 such that inverter 315 responds to signal 310 slowly. As a result, slew node 320 is pulled up slowly, immediately after slew node 321 is low. Similar condition happens during the output high to low transition. A high speed signal 311 disables the slew control unit 360 and delay unit 351 so that both slew nodes 320 and 321 are switched quickly. A low speed signal 311 enables the slew control unit 360 and delay unit 351 so that both slew nodes 320 and 321 are switched slowly.

Di/dt generally is at its highest level when transistors 325 and 326 begin to switch off. Transistor 325 begins to switch when the voltage on slew node 320 approaches the sum of the trip point voltage of transistor 325 and the voltage of output pad 340. Transistor 326 begins to switch when the voltage on slew node 321 approaches the trip point voltage of transistor 326. Di/dt generally becomes negligible once the voltages on slew nodes 320 and 321 pass these levels. Thus, the biggest voltage bounce of the power bus occurs when slew node 321 crosses the voltage of transistor 326 and slew node 320 crosses the sum of the voltage of transistor 325 and output pad 340. Thus, the slew rate of output switches 325 and 326 needs to be decreased at these voltage levels in order to minimize already high di/dt levels. However, the slew rate of output switches 325 and 326 does not need to be decreased during periods when the level of di/dt is low. Consequently, if the slew rate of output switches 325 and 326 are preprogrammed to be low at all times, performance is compromised during periods when di/dt is at a low level.

Figure 5:
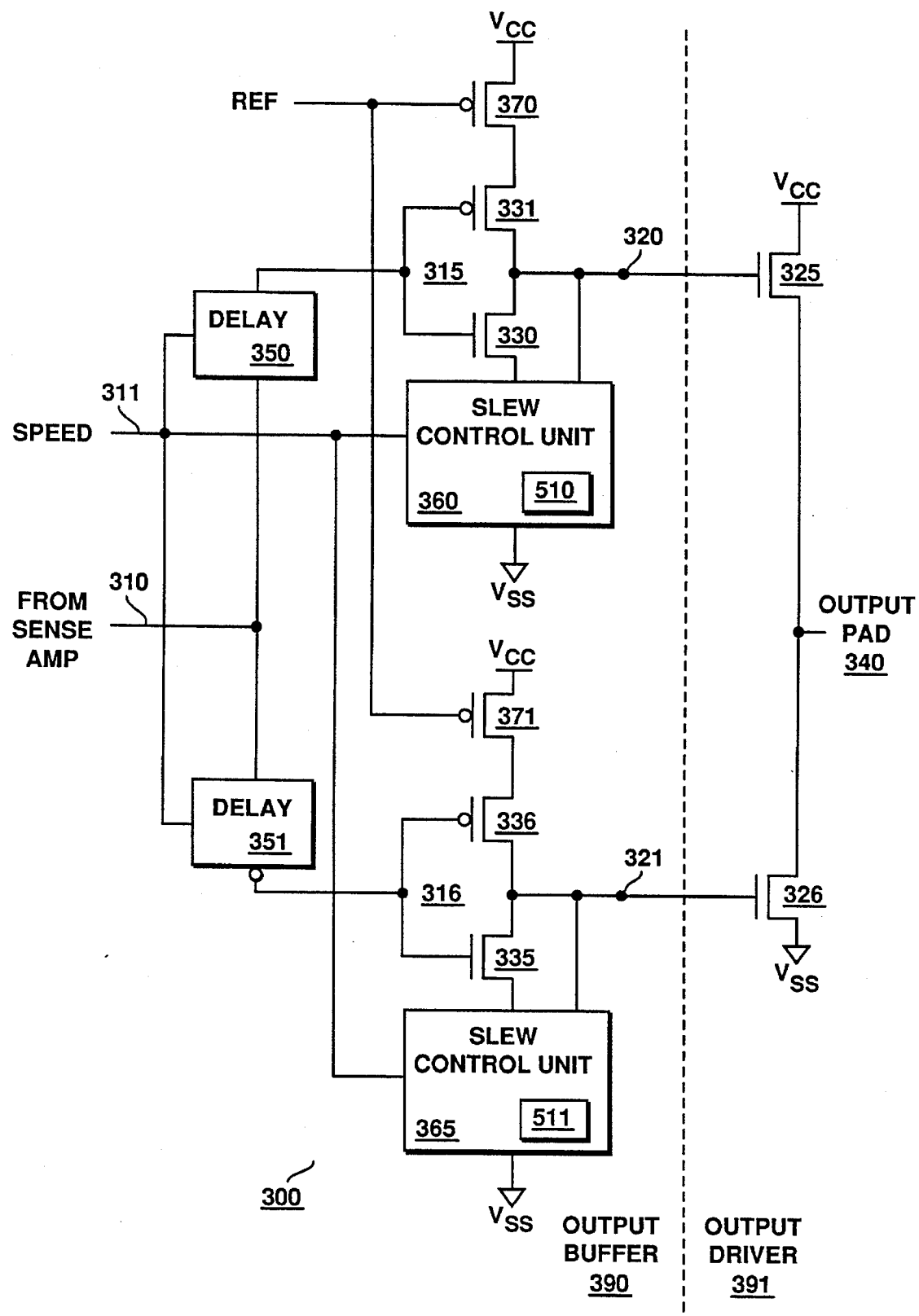
FIG. 5 is a block diagram illustrating a second embodiment of the present invention.

FIG. 5 illustrates a block diagram of another embodiment of the present invention. Slew control 360 further comprises variable slew control circuit 510. Variable slew control circuit 510 is coupled to slew node 320. Variable slew control circuit 510 detects when the voltage at slew node 320 approaches the sum of the trip point voltage of transistor 325 and the voltage of the output pad 340, when di/dt is at a high level. During these periods, variable slew control circuit 510 adjusts the slew rate of transistor 325 to a slow rate. This minimizes di/dt at the output pad 340. However, once variable slew control circuit 510 detects that the voltage at slew node 320 is below that of the sum of the trip point voltage of transistor 325 and output pad 340, it increases the slew rate of transistor 325. This increases the rate at which switch 325 turns off.

Similarly, slew control 365 further comprises variable slew control circuit 511. Variable slew control circuit 511 is coupled to slew node 321. Variable slew control circuit 511 detects when the voltage on slew node 321 approaches that of the trip point voltage of transistor 326, when di/dt is at a high level. During these periods, variable slew control circuit 511 adjusts the slew rate of transistor 326 to a slow rate. This minimizes di/dt at the output pad 340.

Variable slew control circuits 510 an 511 achieves noise reduction by slowing down the slew rates of output transistors 325 and 326 at voltage levels causing maximum di/dt. At voltage levels where di/dt is minimal, variable slew control circuits 510 and 511 permits the slew rates of output transistors 325 and 326 to operate at higher rates. This improves the overall performance of the output circuit.

Another function of variable slew control 510 is to prevent glitches to appear at the output pad 340. At the output high to low transition, transistor 325 is turned off and transistor 326 is turned on. Since output driver 391 uses NMOS transistor 325 as a pull-up transistor, the state of transistor 325 depends on both the voltage on slew node 320 and the voltage on output pad 340. Transistor 325 will be off only when the potential of slew node 320 is lower than the sum of the potentials on output pad 340 and the thevenin voltage of transistor 325. When 325 is turned off, the output pad voltage starts to fall. Slew node 320 must have a faster falling rate than that of output pad 340. Otherwise, transistor 325 will be turned back on when the voltage at output pad 340 is lower than the voltage on slew node 320 by more than the thevenin voltage of transistor 325. If transistor 325 is switched back on, the output pad 340 will be pulled up to form a glitch. Also, the short circuit "crowbar" current through transistors 325 and 326 will increase current consumption. Variable slew control 510 prevents this from occurring by increasing the falling slew rate of slew node 320 after transistor 325 has been turned off. Slew node 320 is then guaranteed to fall faster than output pad 340 and transistor 325 is guaranteed to be off. This kind of implementation may also be used on all buffers with NMOS pull-up transistors to prevent glitches at the output.

Figure 6:
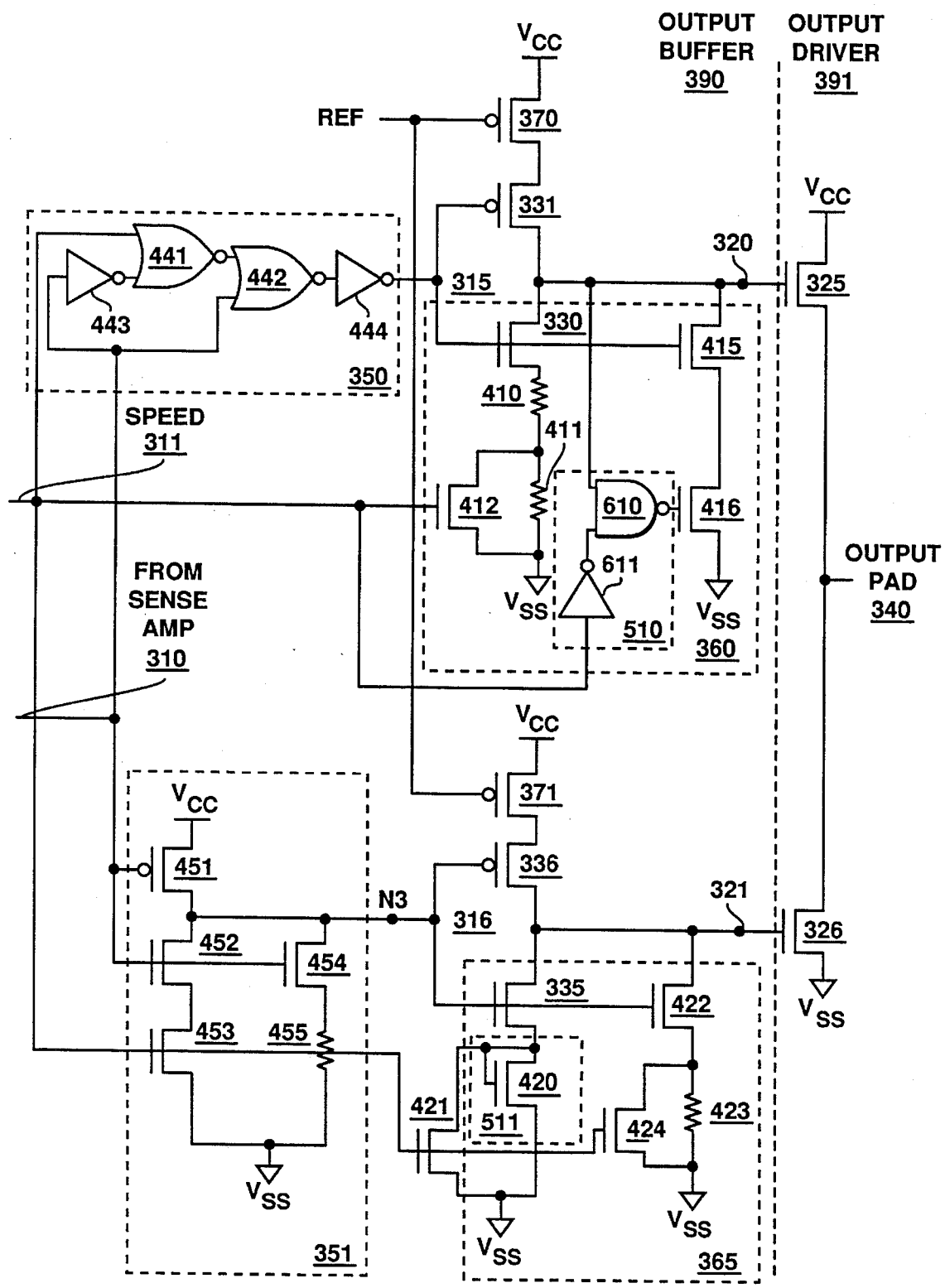
FIG. 6 is a schematic of an output circuit according to a second embodiment of the present invention.

FIG. 6 illustrates a schematic of one embodiment of the present invention. Variable slew control circuit 510 comprises NAND gate 610 and inverter 611. The input of inverter 611 is coupled to speed line 311. The inputs of NAND gate 611 are coupled to slew node 320 and output of inverter 611. The output of NAND gate 611 is coupled to the gate of transistor 416. Variable slew control circuit 510 adjusts the slew rate of output switch 325 so that it switches off quickly when di/dt is negligible. NAND gate 610 is programmed to recognize a high signal when a voltage applied to it is equal or greater than the sum of the trip point voltage of transistor 325 and the voltage of output pad 340.

When sense amplifier line 310 is low, the voltage at slew node 320 is greater or equal to the sum of the trip point voltage of transistor 325 and the voltage of output pad 340. This allows output switch 325 to be switched on. When the signal on sense amplifier line 310 is switched to low to high, output switch 325 needs to switched off. The voltage on slew node 320 is driven to ground through a first falling path. Voltage is driven slowly to ground through resistors 410 and 411. This permits output switch 325 to turn off gradually over a period of time, thus reducing di/dt of the decreasing output current when di/dt is at a high level. However, after the voltage at slew node 320 is below that of the voltage of the sum of the trip point voltage of output switch 325 and output pad 340, NAND gate switches transistor 416 on, providing a second falling path between slew node 320 and ground. This allows the voltage on slew node 320 to be driven to ground quickly and permits output switch 325 to be turned off completely quickly. Variable slew control circuit 510 allows output switch 325 to initially switch slowly when di/dt is at a high level and then later switch quickly when di/dt is at a low level.

Variable slew rate control circuit 511 comprises diode 420. Diode 420 is coupled in parallel with transistor 421 with the source of transistor 420 and ground. Variable slew control circuit 511 adjusts the slew rate of output switch 326 so that it switches off quickly when di/dt is at low levels but switches off slowly when di/dt is at high levels.

When sense amplifier line 310 is high, the voltage at slew node 321 is greater than or equal to the voltage of the trip point of transistor 326. This allows output switch 326 to be switched on. When the signal on sense amplifier line 310 switches from high to low, output switch 326 needs to be switched off. The voltage on slew node 321 is driven to ground through a first and a second falling path. Voltage is driven to ground through diode 420 on the first falling path. Voltage is also driven to ground through transistor 422 and resistor 423. The two falling paths permit slew node 321 to quickly approach the trip point voltage which causes output switch 326 to turn off. However, once the voltage at slew node 321 approaches the trip point voltage of output switch 326, diode 420 turns off. This closes the first falling path. At this point, only the second falling path through transistor 422 and 423 is open to discharge slew node 321 to ground, slowing the slew rate of transistor 326. This permits output switch 326 to turn off gradually over a period of time, reducing di/dt of the decreasing output current when di/dt is at a high level.

Variable slew rate control circuits 510 and 511 can be disabled by programming the speed line to output an active signal. A high signal on speed line 311 causes NAND circuit 610 to turn on the second falling path for slew node 320 and to provide a bypass through resistor 411 at all times. A high signal on speed line 311 also switches on transistors 421 and 424, providing a high speed bypass for slew node 321 at all times.

Figure 7:
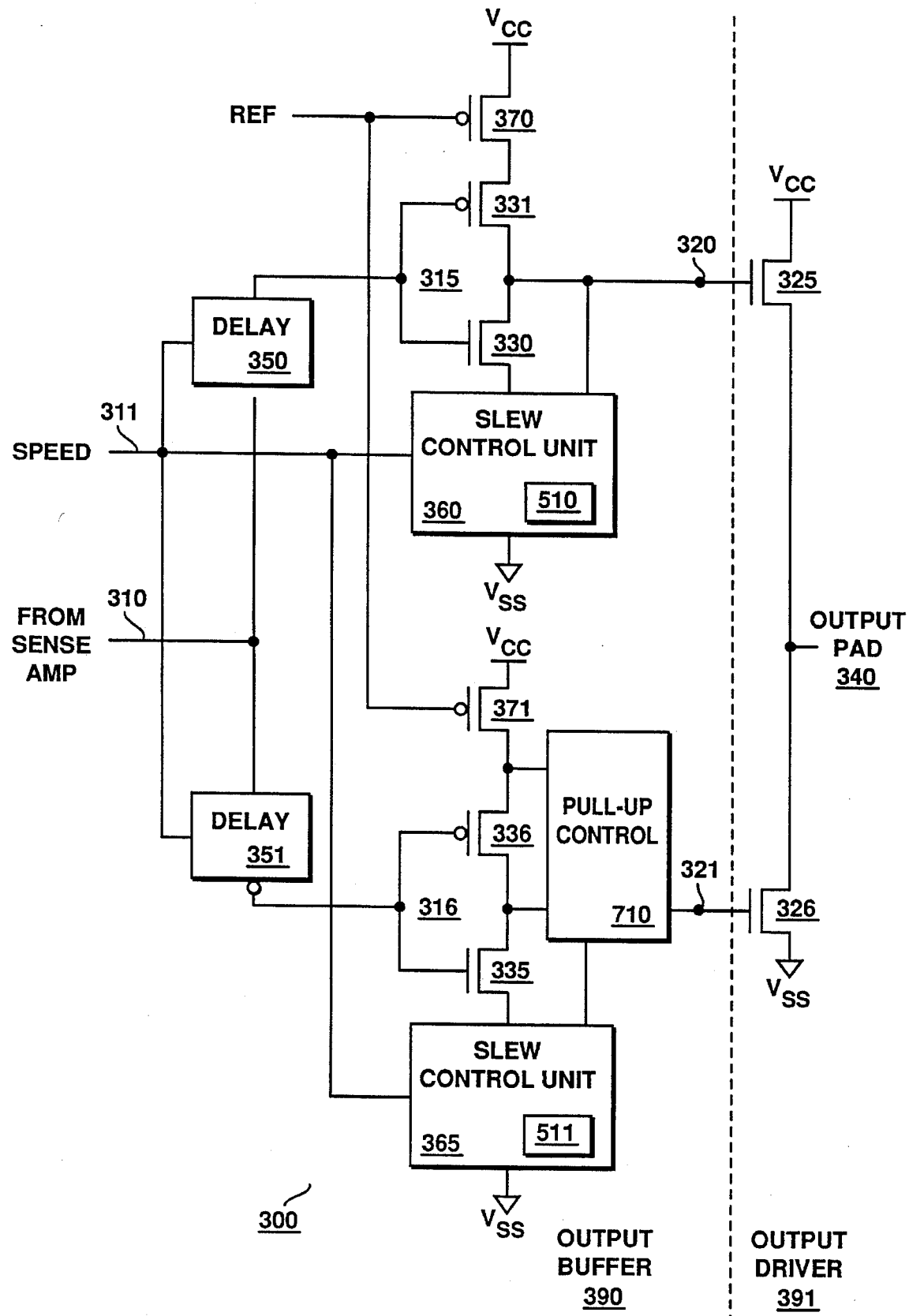
FIG. 7 is a block diagram of a third embodiment of the present invention.

FIG. 7 illustrates a block diagram of another embodiment of the present invention. Pull-up control 710 is coupled to transistor 336 and slew node 321. Pull-up control 710 controls the rate in which output transistor 326 turns on. Pull-up control 710 reduces di/dt generated when output switch 326 switches on too quickly. FIG. 7 shows an embodiment of the present invention where a single pull-up control 710 is implemented for output switch 326. In another embodiment of the present invention, an additional pull-up control 710 may be implemented to control the rate in which output transistor 325 switches on. In still another embodiment of the present invention, pull-up control 710 may be used alone or in conjunction with slew control unit 360 and 365.

Figure 8:
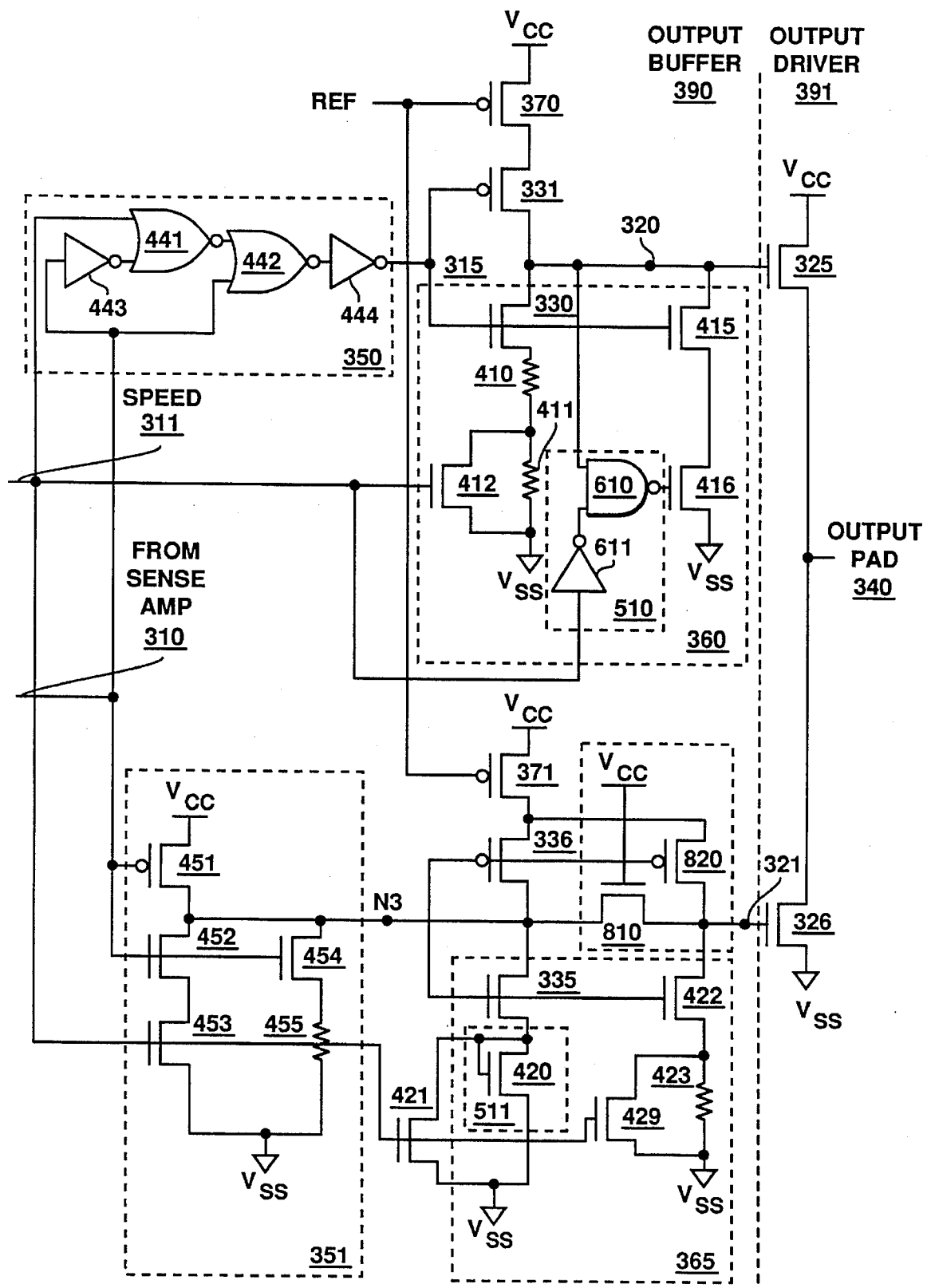
FIG. 8 is a schematic of an output circuit according to a third embodiment of the present invention.

FIG. 8 illustrates a schematic of the pull-up control 710 according to one embodiment of the present invention. Pull-up control 710 comprises transistors 810 and 820. When sense amplifier line 310 is low, the voltage at slew node 321 is approximately zero. When the signal on sense amplifier line 310 is switched from low to high, the voltage on slew node 321 is pulled up to Vcc through a first and second rising path. The first rising path connects slew node 321 to Vcc though transistors 336 and 371. The second rising path connects slew node 321 to Vcc though transistors 820 and 371. Transistor 810 clamps slew node 321 from being charged to Vcc through transistor 336 during read mode. Slew node 321 is charged to Vcc minus the trip voltage of transistor 810 by both transistor 336 and 820. Transistor 810 is shut off when the slew node voltage reaches Vcc minus the trip point voltage of transistor 810, closing the path through transistor 336. This slows down the rising rate of the voltage on slew node 321, reducing di/dt caused by the quick switching on of output transistor 326.

Figure 9:
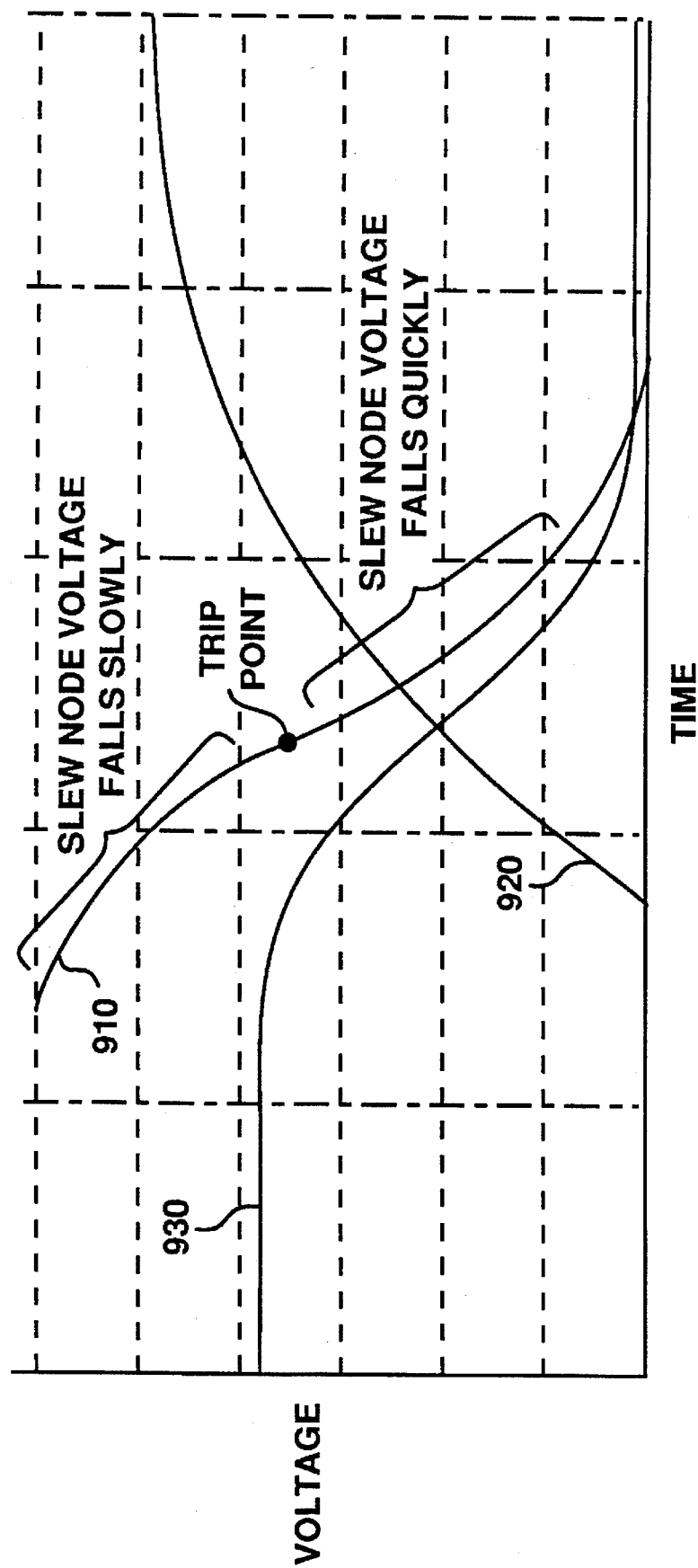
FIG. 9 is a voltage versus time plot of slew nodes when a device driver circuit is switching to a low signal.

FIG. 9 illustrates a voltage versus time plot of critical locations in the output circuit of the present invention when sense amplifier line 310 is switching from a low signal to a high signal. Curve 910 is a voltage curve of slew node 320. Curve 920 is a voltage curve of slew node 321. Curve 930 is a voltage curve of the output pad 340. The voltage on slew node 320 initially drops slowly as it approaches the sum of the trip point voltage of output switch 325 and the voltage on output pad 340. After the voltage on slew node 320 passes this voltage level, the voltage level on the node drops quickly.

Figure 10:
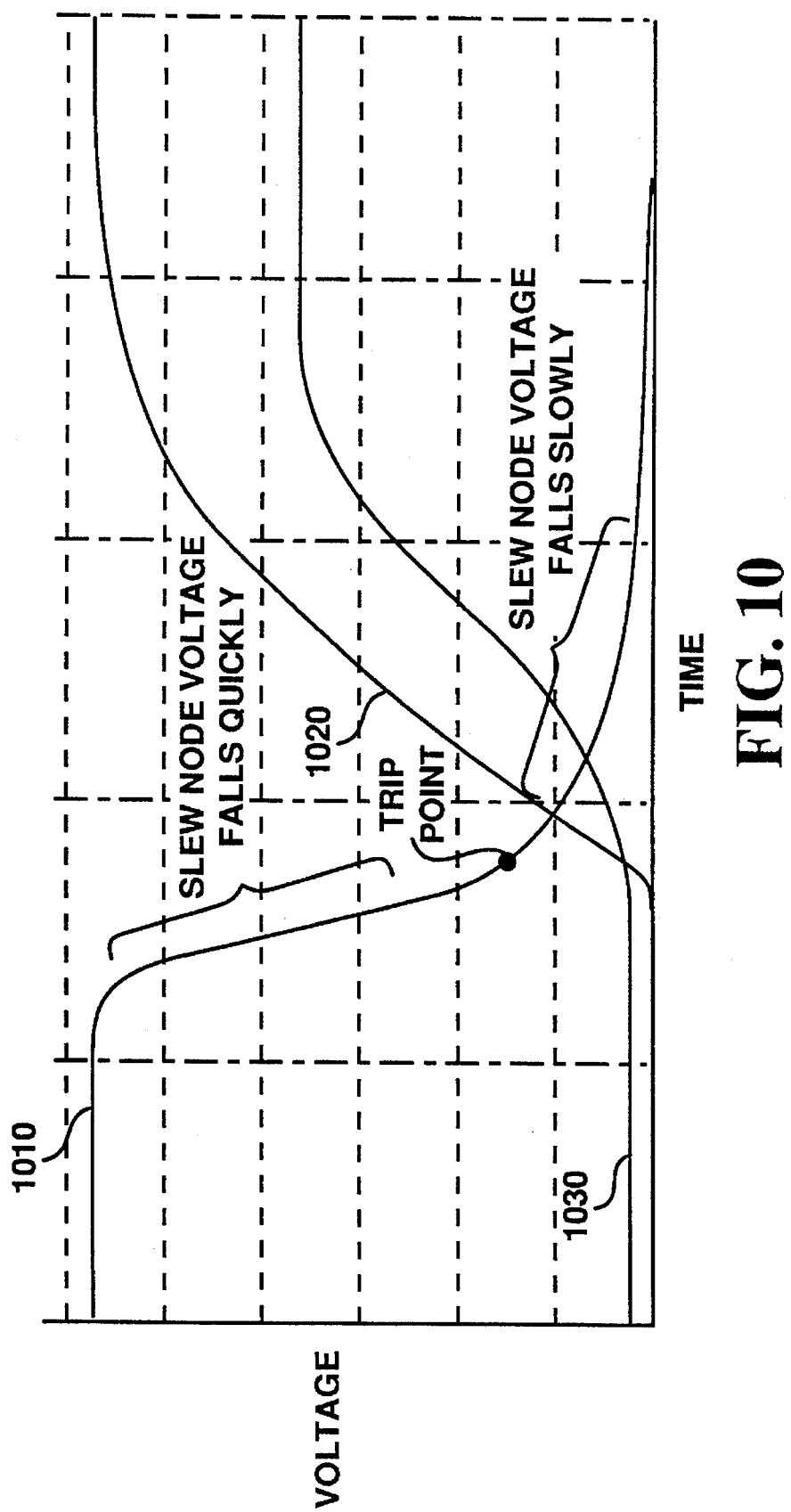
FIG. 10 is a voltage versus time plot of slew nodes when a device driver circuit is switching to a high signal.

FIG. 10 illustrates a voltage versus time plot of critical locations in the output circuit of the present invention when sense amplifier line 310 is switching from a high signal to a low signal. Curve 1010 is a voltage curve of slew node 321. Curve 1020 is a voltage curve of slew node 320. Curve 1030 is a voltage curve of the output pad 340. The voltage on slew node 321 initially drops quickly as it approaches the trip point voltage of output switch 326. After the voltage on slew node 321 passes this voltage level, the voltage level on the node drops slowly.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, an apparatus for reducing noise on a output pad is disclosed. The apparatus reduces di/dt generated by the output switches on the device driver.

What is claimed is:

1. An output circuit comprising:
   a first line that receives an input signal to said output circuit;
   a second line selectable to have one of a first and second state;
   a first circuit coupled to said first line having a first slew node, said first circuit responsive to said input signal that controls a voltage on said first slew node;
   a second circuit coupled to said first line having a second slew node, said second circuit responsive to said input signal that controls a voltage on said second slew node;
   a driver circuit coupled to said first circuit and to said second circuit said driver circuit having a first transistor responsive to said voltage on said first slew node and a second transistor responsive to said voltage on said second slew node that generates an output signal;
   a first variable slew control circuit coupled to said first slew node, said first circuit, and said second line, said first variable slew control circuit increases a rate at which current at said first slew node is driven to ground when said voltage at said first slew node is below a first predetermined voltage; and a second variable slew control circuit coupled to said second slew node, said second circuit and said second line, said second variable slew control circuit decreases a rate at which current at said second slew node is driven to ground when said voltage at said second slew node approaches a second predetermined voltage.

2. The output circuit of claim 1 further comprising a delay circuit coupled to said first line and said second circuit, said delay circuit delays a time said input signal is sent to said second circuit so that said first circuit is finished processing said input signal before said second circuit.

3. The output circuit of claim 1, wherein said first variable slew control circuit comprises a first path and a second path coupling said first slew node to said ground, wherein said second current path is disconnected by said first variable slew control circuit to decrease said rate which said voltage on said first slew node is driven to said ground when di/dt at said driver circuit is above a predetermined level.

4. The output circuit of claim 1, wherein said second variable slew control circuit comprises a first current path and a second current path coupling said second slew node to said ground, wherein said second current path is disconnected by said second variable slew control circuit to decrease said rate which said voltage on said second slew node is driven to said ground when di/dt at said driver circuit is above a predetermined level.

5. The output circuit of claim 1, wherein said second line deactivates said first variable slew control circuit when said second line is selected to a first state.

6. The output circuit of claim 1, wherein said second line deactivates said second variable slew control circuit when said second line is selected to a first state.

7. The output circuit of claim 1 further comprising a pull-up control circuit coupled to said second slew node and said second circuit for decreasing a rate which said second slew node is driven to a supply voltage when di/dt at said driver circuit is above a predetermined level.

8. The output circuit of claim 1 further comprising a pull-up control circuit coupled to said first slew node for decreasing a rate which said first slew node is driven to said supply voltage when di/dt at said driver circuit is above said predetermined level.

9. The output circuit of claim 1 further comprising a first slew control unit coupled to said first circuit and to said second line, said first slew control unit controlling a rate in which said voltage on said first slew node is driven to ground in response to said first state and said second state.

10. The output circuit of claim 1 further comprising a second slew control unit coupled to said second circuit and said second line, said second slew control unit controlling a rate in which said voltage on said second slew node is driven to ground in response to said first state and said second state.

11. The output circuit of claim 1, wherein said first predetermined voltage equals a sum of a trip point voltage of said first transistor and a voltage of said output signal.

12. The output circuit of claim 1, wherein said second predetermined voltage equals a trip point voltage of said second transistor.

* * * * *